(12) United States Patent
Li et al.

(10) Patent No.: US 12,527,111 B2
(45) Date of Patent: Jan. 13, 2026

(54) SOLAR CELL AND PHOTOVOLTAIC MODULE

(71) Applicant: ZHEJIANG JINKO SOLAR CO., LTD., Zhejiang (CN)

(72) Inventors: Huimin Li, Zhejiang (CN); Menglei Xu, Zhejiang (CN); Jie Yang, Zhejiang (CN); Xinyu Zhang, Zhejiang (CN)

(73) Assignee: ZHEJIANG JINKO SOLAR CO., LTD., Zhejiang (CN)

( * ) Notice: Subject to any disclaimer, the term of this patent is extended or adjusted under 35 U.S.C. 154(b) by 0 days.

(21) Appl. No.: 18/635,870

(22) Filed: Apr. 15, 2024

(65) Prior Publication Data

US 2025/0261474 A1    Aug. 14, 2025

(30) Foreign Application Priority Data

Feb. 8, 2024    (CN) .......................... 202410178344.5

(51) Int. Cl.
*H10F 77/14*    (2025.01)
*H10F 10/14*    (2025.01)
*H10F 19/80*    (2025.01)

(52) U.S. Cl.
CPC ........... *H10F 77/147* (2025.01); *H10F 10/14* (2025.01); *H10F 19/80* (2025.01)

(58) Field of Classification Search
CPC ........ H10F 10/14; H10F 10/166; H10F 19/80; H10F 77/147; H10F 77/16; H10F 77/211; H10F 77/703
See application file for complete search history.

(56) References Cited

U.S. PATENT DOCUMENTS

2009/0229655 A1    9/2009  Lee
2011/0037133 A1*   2/2011  Su .......................... H10F 71/121
                                                      257/E31.127
(Continued)

FOREIGN PATENT DOCUMENTS

CN    109786476 A    5/2019
CN    111755552 A    10/2020
(Continued)

OTHER PUBLICATIONS

Zhejiang Jinko Solar Co., Ltd., CN First Office Action with English Translation, CN 2024101783445, Mar. 27, 2024, 13 pgs.
(Continued)

*Primary Examiner* — Golam Mowla
(74) *Attorney, Agent, or Firm* — USCH Law, PC

(57) ABSTRACT

Embodiments of the present disclosure provide a solar cell and a photovoltaic module. The solar cell includes: a substrate having a front surface and a rear surface, a first doped polycrystalline silicon layer doped with N-type dopant ions and disposed over the front surface or over the rear surface, and a second doped polycrystalline silicon layer doped with P-type dopant ions and disposed over the rear surface. A surface of the first doped polycrystalline silicon layer away from the substrate has a plurality of first protrusion structures. A surface of the second doped polycrystalline silicon layer away from the substrate has a plurality of second protrusion structures. An average thickness of the first protrusion structures is greater than an average thickness of the second protrusion structures, and a thickness of the first doped polycrystalline silicon layer is not greater than a thickness of the second doped polycrystalline silicon layer.

20 Claims, 7 Drawing Sheets

(56) References Cited

U.S. PATENT DOCUMENTS

| | | | | |
|---|---|---|---|---|
| 2014/0096821 | A1* | 4/2014 | Chen | H10F 77/14 438/96 |
| 2014/0295613 | A1* | 10/2014 | O'Sullivan | H10F 77/211 438/482 |
| 2015/0325716 | A1* | 11/2015 | Baker-O'Neal | H10F 71/128 438/72 |
| 2016/0126394 | A1* | 5/2016 | Romijn | H10F 77/703 438/71 |
| 2018/0315866 | A1 | 11/2018 | Cheong et al. | |
| 2022/0376124 | A1 | 11/2022 | Feng et al. | |
| 2023/0411543 | A1 | 12/2023 | Li et al. | |

FOREIGN PATENT DOCUMENTS

| | | |
|---|---|---|
| CN | 113299770 A | 8/2021 |
| CN | 215869407 U | 2/2022 |
| CN | 114709294 A | 7/2022 |
| CN | 114784148 A | 7/2022 |
| CN | 115274869 A | 11/2022 |
| CN | 115566088 A | 1/2023 |
| CN | 117238987 A | 12/2023 |
| CN | 117525179 A | 2/2024 |
| CN | 117727809 A | 3/2024 |
| CN | 118053928 A | 5/2024 |
| CN | 118335814 A | 7/2024 |
| CN | 118412408 A | 7/2024 |
| CN | 118553805 A | 8/2024 |
| DE | 202023101309 U1 | 4/2023 |
| DE | 202023101527 U1 | 5/2023 |
| JP | 2004140087 A | 5/2004 |
| JP | 2005136081 A | 5/2005 |
| JP | 2005150614 A | 6/2005 |
| JP | 2008047792 A | 2/2008 |
| JP | 2016134628 A | 7/2016 |
| JP | 2016225627 A | 12/2016 |
| JP | 2017135421 A | 8/2017 |
| JP | 2019117963 A | 7/2019 |
| JP | 2021093393 A | 6/2021 |
| JP | 2022058069 A | 4/2022 |
| JP | 2023024428 A | 2/2023 |
| JP | 2023508244 A | 3/2023 |
| JP | 2024040441 A | 3/2024 |
| WO | 2011002086 A1 | 1/2011 |
| WO | 2015045809 A1 | 4/2015 |
| WO | 2015105121 A1 | 7/2015 |
| WO | 2016114371 A1 | 7/2016 |
| WO | 2020090423 A1 | 5/2020 |
| WO | 2023235390 A2 | 12/2023 |

OTHER PUBLICATIONS

Petrik, P et al., "Comparative study of surface roughness measured on polysilicon using spectroscopic ellipsometry and atomic force microscopy", Thin Solid Films, vol. 315, No. 1-2, Mar. 2, 1998, p. 186-191, 6 pgs.

Zhejiang Jinko Solar Co., Ltd., AU First Examination Report, AU 2024202626, Feb. 21, 2025, 8 pgs.

Zhejiang Jinko Solar Co., Ltd., Extended European Search Report, EP 24169786.1, Oct. 29, 2024, 105 pgs.

Zhejiang Jinko Solar Co., Ltd., Notification of grant of patent right for invention with English translation, CN 2024101783445, May 20, 2024, 6 pgs.

Meiyu Zhang et al., "One Dimensional Model Calculation for Polycrystalline Silicon Solar Cells", Semiconductor Optoelectronics, vol. 29, Oct. 15, 2018, p. 631-p. 635, 5 pgs.

* cited by examiner

SOLAR CELL AND PHOTOVOLTAIC MODULE

CROSS REFERENCE TO RELATED APPLICATIONS

The present application claims the benefit of priority under the Paris Convention to Chinese Patent Application No. 202410178344.5 filed on Feb. 8, 2024, which is incorporated herein by reference in its entirety.

TECHNICAL FIELD

Embodiments of the present disclosure relate to the field of photovoltaic technologies, and in particular to a solar cell and a photovoltaic module.

BACKGROUND

A solar cell is a device that converts solar energy into electrical energy. Solar cells generate carriers based on the photovoltaic principle, and the carriers are transferred out through electrodes to efficiently utilize the electrical energy. Existing solar cells mainly include interdigitated back contact (IBC) cells, tunnel oxide passivated contact (TOPCon) cells, passivated emitter and rear cells (PERCs), and heterojunction cells. Optical losses and recombination of photo-generated carriers at a surface and in an interior of a silicon substrate of a solar cell can be reduced by forming film layers having various functions, thereby improving photoelectric conversion efficiency of the solar cell.

However, the photoelectric conversion efficiency of the existing solar cells still needs to be improved.

SUMMARY

Embodiments of the present disclosure provide a solar cell and a photovoltaic module, which are at least conducive to improvement of photoelectric conversion efficiency of a solar cell.

In some embodiments of the present disclosure, a solar cell is provided. The solar cell includes: a substrate having a front surface and a rear surface opposite to each other, a first doped polycrystalline silicon layer doped with N-type dopant ions and disposed over the front surface or over the rear surface, a second doped polycrystalline silicon layer doped with P-type dopant ions and disposed over the rear surface, and first electrodes and second electrodes. The first electrodes are in electrical contact with the first doped polycrystalline silicon layer, and the second electrodes are in electrical contact with the second doped polycrystalline silicon layer. A surface of the first doped polycrystalline silicon layer away from the substrate has a plurality of first protrusion structures. The second doped polycrystalline silicon layer is insulated from the first doped polycrystalline silicon layer, and a surface of the second doped polycrystalline silicon layer away from the substrate has a plurality of second protrusion structures. An average thickness of the plurality of first protrusion structures is greater than an average thickness of the plurality of second protrusion structures, and a thickness of the first doped polycrystalline silicon layer is less than or equal to a thickness of the second doped polycrystalline silicon layer.

In some embodiments, a roughness of the surface of the first doped polycrystalline silicon layer having the plurality of first protrusion structures is greater than a roughness of the surface of the second doped polycrystalline silicon layer having the plurality of second protrusion structures.

In some embodiments, the roughness of the surface of the first doped polycrystalline silicon layer having the plurality of first protrusion structures ranges from 10 nm to 30 nm.

In some embodiments, the roughness of the surface of the second doped polycrystalline silicon layer having the plurality of second protrusion structures ranges from 0 nm to 20 nm.

In some embodiments, the average thickness of the plurality of first protrusion structures is less than or equal to 30 nm.

In some embodiments, the average thickness of the plurality of second protrusion structures is less than or equal to 20 nm.

In some embodiments, a size in any one dimension of any of the plurality of first protrusion structures is less than 500 μm.

In some embodiments, a size in any one dimension of any of the plurality of second protrusion structures is less than 300 μm.

In some embodiments, the thickness of the second doped polycrystalline silicon layer ranges from 100 nm to 400 nm.

In some embodiments, the thickness of the first doped polycrystalline silicon layer ranges from 50 nm to 300 nm.

In some embodiments, the first doped polycrystalline silicon layer is disposed over the rear surface and includes a plurality of portions, the second doped polycrystalline silicon layer includes a plurality of portions, and the plurality of portions of the first doped polycrystalline silicon layer interleave with the plurality of portions of the second doped polycrystalline silicon layer. The rear surface has a plurality of N regions and a plurality of P regions, each portion of the plurality of portions of the first doped polycrystalline silicon layer is disposed over a respective N region of the plurality of N regions, and each portion of the plurality of portions of the second doped polycrystalline silicon layer is disposed over a respective P region of the plurality of P regions.

In some embodiments, in a direction perpendicular to the substrate, at least one of one respective first protrusion structure of the plurality of first protrusion structures or one respective second protrusion structure of the plurality of second protrusion structures has a cross section being shaped as one or more of parabolas, sectors, trapezoids, and approximate trapezoids.

In some embodiments of the present disclosure, a photovoltaic module is provided. The photovoltaic module includes: at least one cell string formed by connecting a plurality of solar cells as described above, at least one encapsulation adhesive layer configured to cover a surface of the at least one cell string, and at least one cover plate configured to cover a surface of the at least one encapsulation adhesive layer away from the at least one cell string.

BRIEF DESCRIPTION OF THE DRAWINGS

One or more embodiments are exemplarily illustrated in reference to corresponding accompanying drawing(s), and these exemplary illustrations do not constitute limitations on the embodiments. Unless otherwise stated, the accompanying drawings do not constitute scale limitations. For clearer descriptions of the technical solutions in the embodiments of the present disclosure or in the related technologies, drawings that are to be referred for description of the embodiments are briefly described hereinafter. Apparently, the drawings described hereinafter merely illustrate some embodiments of the present disclosure. Persons of ordinary skill in the art can derive other drawings based on the drawings described herein without any creative effort.

DETAILED DESCRIPTION OF THE EMBODIMENTS

Figure 1:
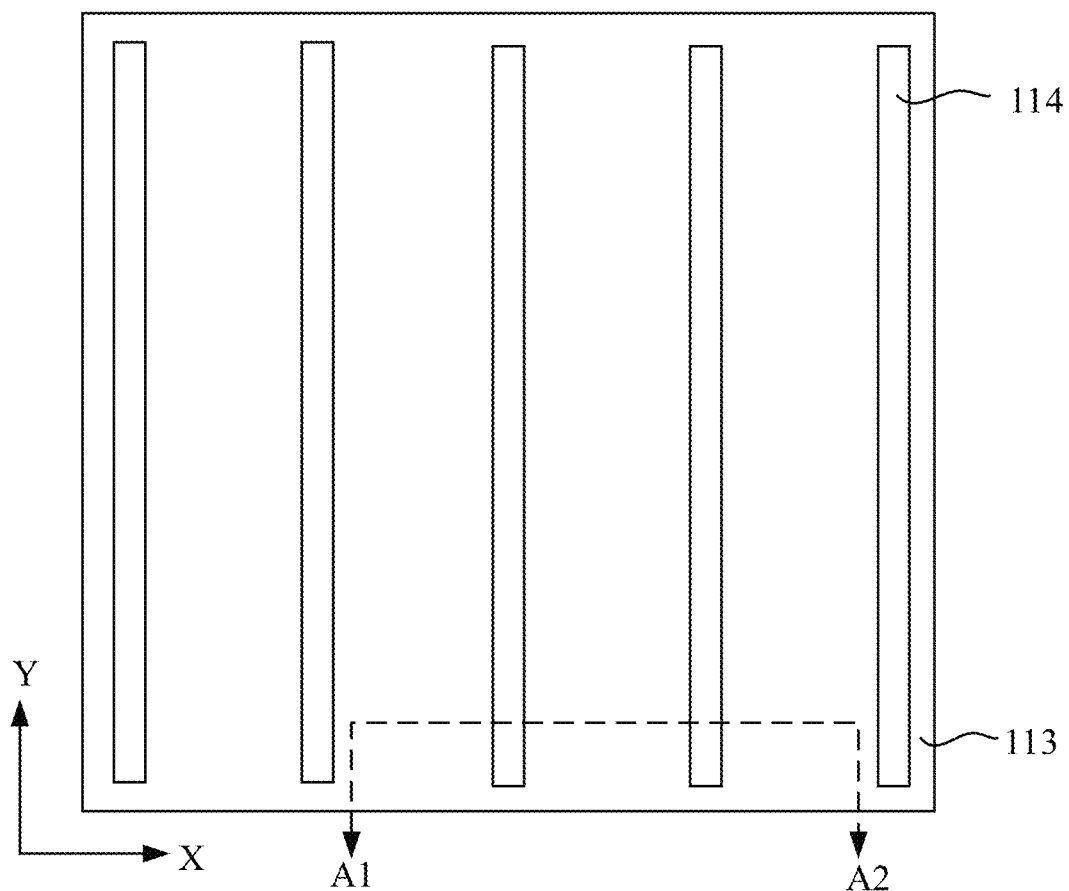
FIG. 1 is a schematic diagram of a structure of a solar cell according to some embodiments of the present disclosure.

When a certain part "includes" another part throughout the specification, other parts are not excluded unless otherwise stated, and other parts may be further included. In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

In the drawings, the thickness of layers and an area has been enlarged for better understanding and ease of description. When it is described that a part, such as a layer, film, area, or substrate, is "over" or "on" another part, the part may be "directly" on another part or a third part may be present between the two parts. In contrast, when it is described that a part is "directly on" another part, it means that a third part is not present between the two parts. Furthermore, when it is described that a part is "generally" formed on another part, it means the part is not formed on the entire surface (or front surface) of another part and is also not formed in part of the edge of the entire surface.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise.

It is known from the background that the photoelectric conversion efficiency of existing solar cells needs to be improved.

In the solar cell according to the embodiments of the present disclosure, the first doped polycrystalline silicon layer is disposed over the front surface or over the rear surface, and the second doped polycrystalline silicon layer is disposed on the rear surface. This indicates that the solar cell is an IBC cell or a TOPCon cell. In the embodiments of the present disclosure, the thickness of the first doped polycrystalline silicon layer is designed to be less than the thickness of the second doped polycrystalline silicon layer. Because the N-type doped polycrystalline silicon layer is of a type of donor, the formed first doped polycrystalline silicon layer has relatively small silicon grains, relatively great bonding tightness between silicon grains, and a resulted relatively small thickness of the formed layer. In contrast, because the P-type doped polycrystalline silicon layer is of a type of acceptor type and has a good compatibility with the substrate, the P-type doped polycrystalline silicon layer has relatively large silicon grains, and thus the second doped polycrystalline silicon layer formed by bonding of the silicon grains has a relatively great thickness.

In addition, the first doped polycrystalline silicon layer is disposed over the front surface or over the rear surface, and the average thickness of the plurality of first protrusion structures is greater than the average thickness of the plurality of second protrusion structures. When the first doped polycrystalline silicon layer is disposed over the front surface, internal reflection in the first doped polycrystalline silicon layer and contact performance between the first doped polycrystalline silicon layer and the first electrodes can be improved. The plurality of second protrusion structures of the second doped polycrystalline silicon layer have relatively small thicknesses, thus the second doped polycrystalline silicon layer can improve passivation performance of the layer formed thereon.

Embodiments of the present disclosure will be described in detail below with reference to the accompanying drawings. Those skilled in the art should understand that, in the embodiments of the present disclosure, many technical details are provided for the reader to better understand the present disclosure. However, even without these technical details and various modifications and variants based on the following embodiments, the technical solutions claimed in the present disclosure can be implemented.

Figure 2:
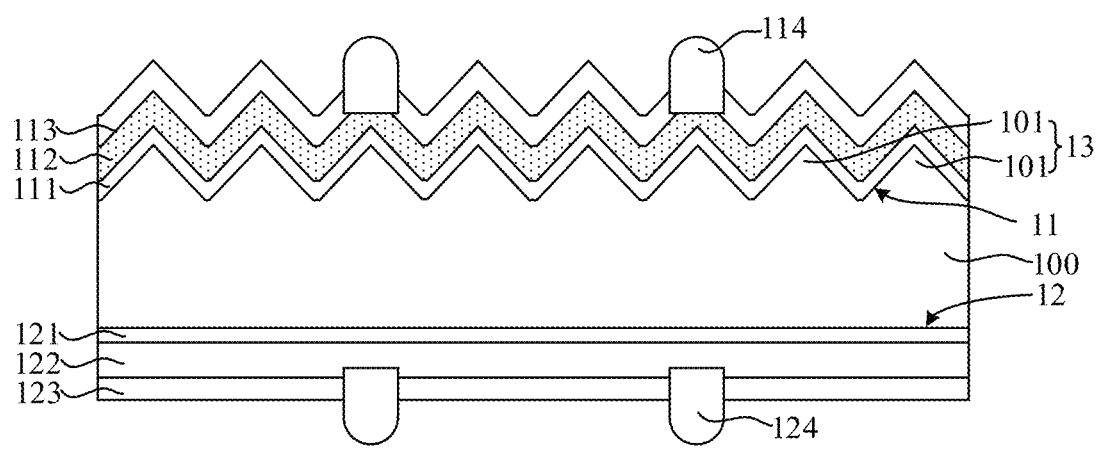
FIG. 2 is a schematic diagram of a structure of a first cross section, taken along a line A1-A2, of the solar cell in FIG. 1.
Figure 3:
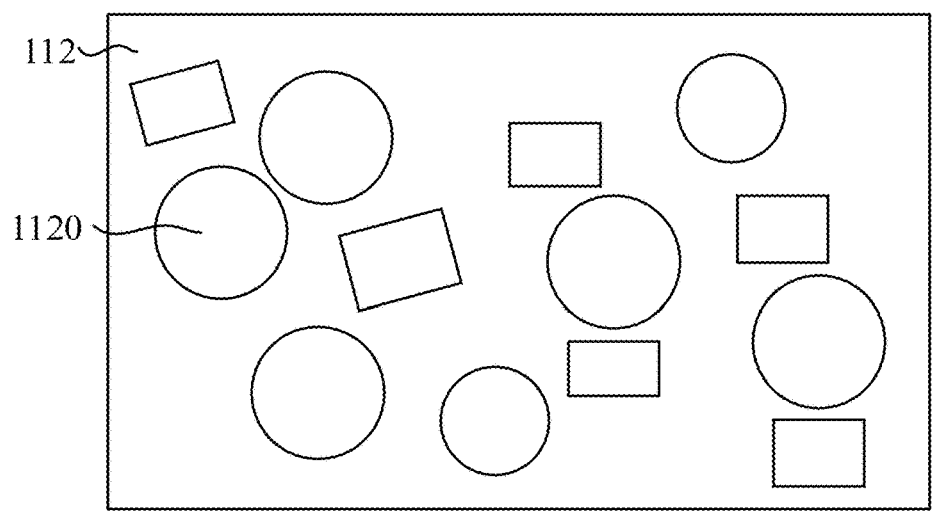
FIG. 3 is a schematic diagram of a structure of a first doped polycrystalline silicon layer of a solar cell according to some embodiments of the present disclosure.
Figure 4:
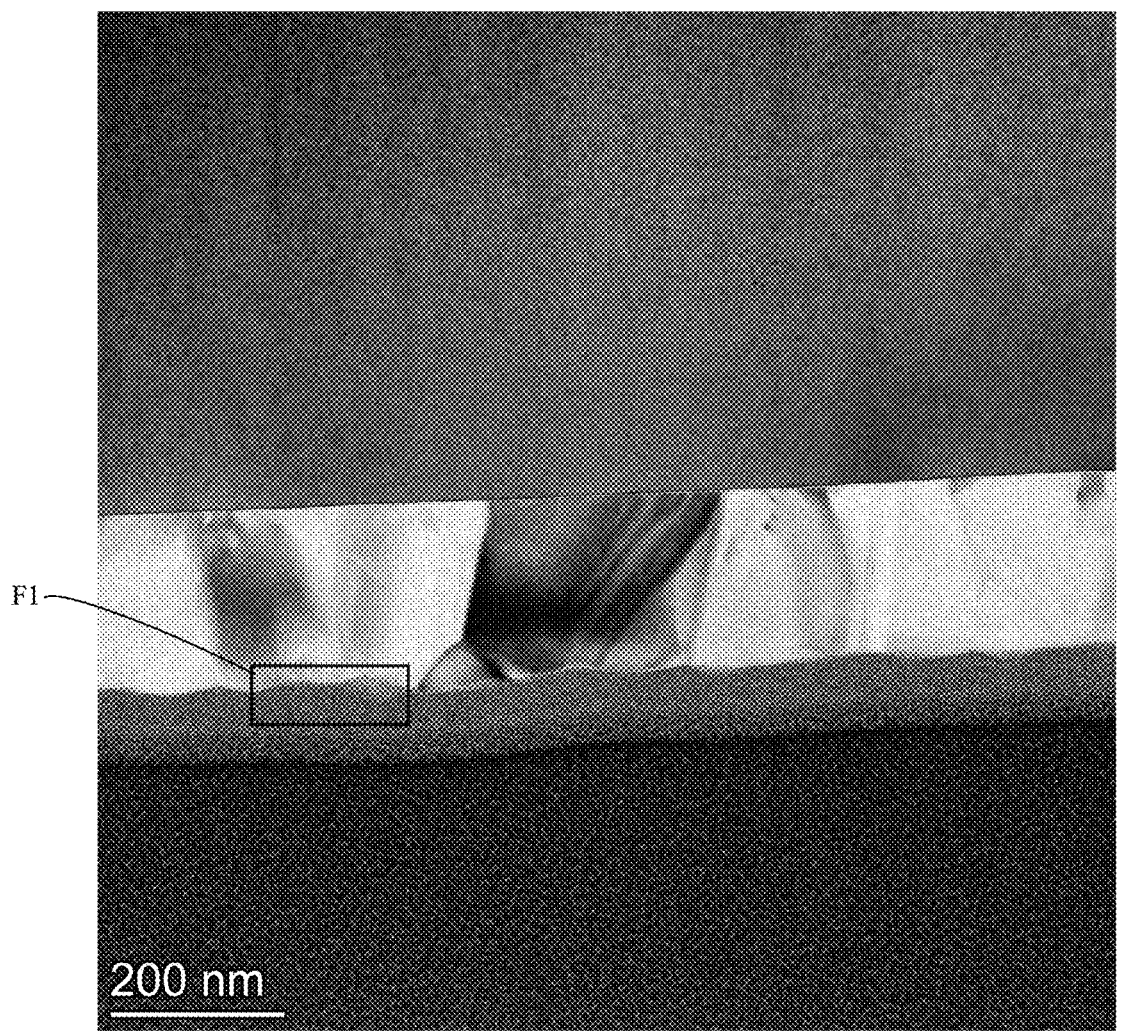
FIG. 4 is an image, obtained using a scanning electron microscopy, of a cross section of the first doped polycrystalline silicon layer of a solar cell according to some embodiments of the present disclosure.
Figure 5:
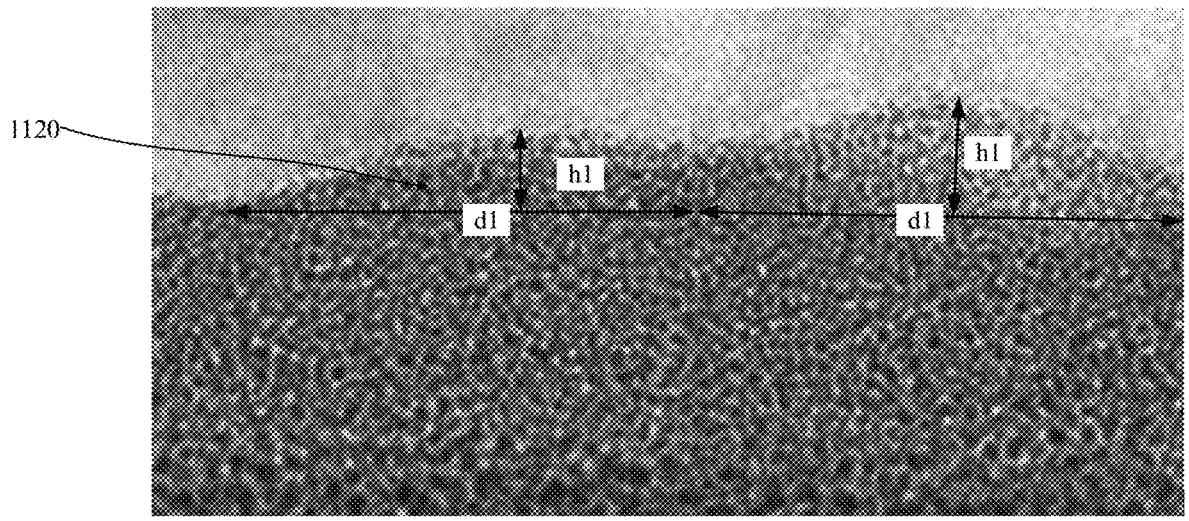
FIG. 5 is a partial enlarged view of a first protrusion structure at F1 in FIG. 4.
Figure 6:
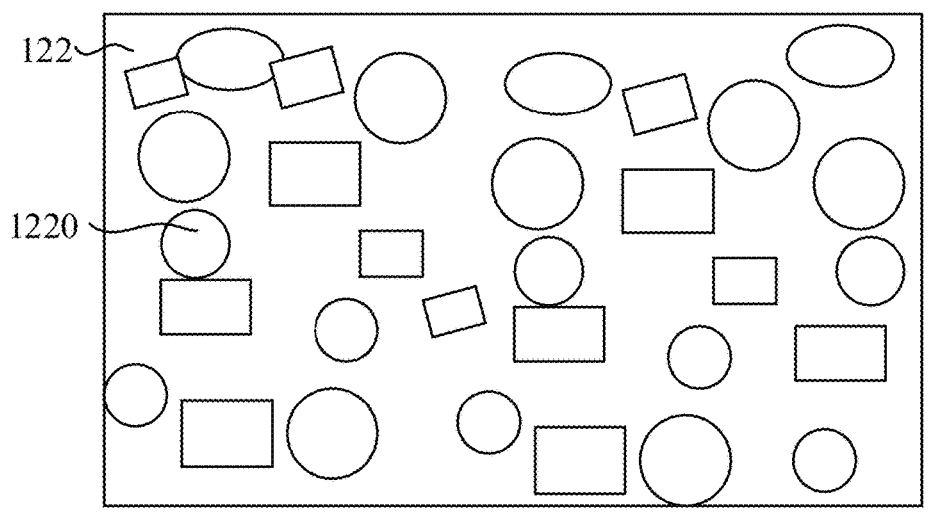
FIG. 6 is a schematic diagram of a structure of a second doped polycrystalline silicon layer of a solar cell according to some embodiments of the present disclosure.
Figure 7:
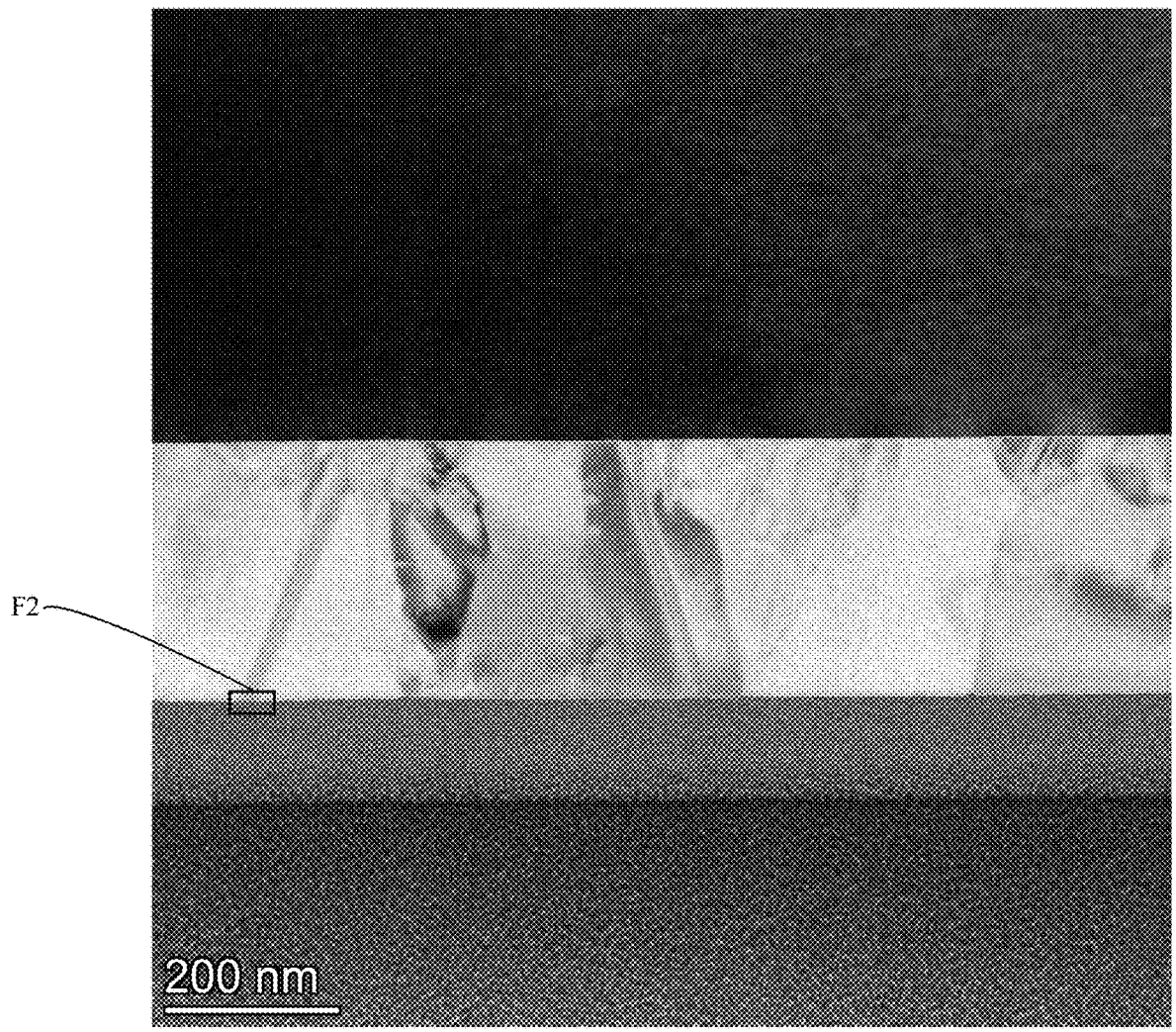
FIG. 7 is an image, obtained using a scanning electron microscopy, of a cross section of the second doped polycrystalline silicon layer of a solar cell according to some embodiments of the present disclosure.
Figure 8:
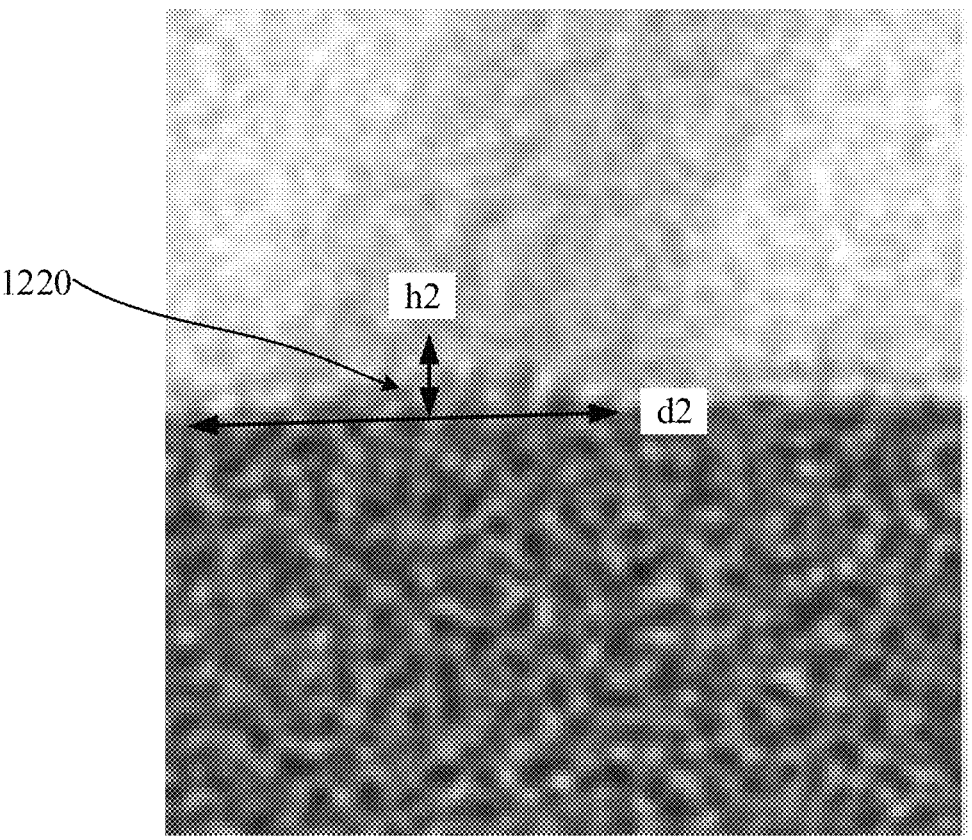
FIG. 8 a partial enlarged view of a second protrusion structure at F2 in FIG. 7.

FIG. 1 is a schematic diagram of a structure of a solar cell according to some embodiments of the present disclosure. FIG. 2 is a schematic diagram of a structure of a first cross section, taken along a line A1-A2, of the solar cell in FIG. 1. FIG. 3 is a schematic diagram of a structure of a first doped polycrystalline silicon layer of a solar cell according to some embodiments of the present disclosure. FIG. 4 is an image, obtained using a scanning electron microscopy, of a cross section of the first doped polycrystalline silicon layer of a solar cell according to some embodiments of the present disclosure. FIG. 5 is a partial enlarged view of a first protrusion structure at F1 in FIG. 4. FIG. 6 is a schematic diagram of a structure of a second doped polycrystalline silicon layer of a solar cell according to some embodiments of the present disclosure. FIG. 7 is an image, obtained using a scanning electron microscopy, of a cross section of the second doped polycrystalline silicon layer of a solar cell according to some embodiments of the present disclosure. FIG. 8 a partial enlarged view of a second protrusion structure at F2 in FIG. 7.

Referring to FIG. 1 and FIG. 2, some embodiments of the present disclosure provide a solar cell. The solar cell includes: a substrate 100 having a front surface 11 and a rear surface 12 opposite to each other, a first doped polycrystalline silicon layer 112 doped with N-type dopant ions and disposed over the front surface 11, a second doped polycrystalline silicon layer 122 doped with P-type dopant ions and disposed over the rear surface 12, and first electrodes 114 and second electrodes 124. The first electrodes 114 are in electrical contact with the first doped polycrystalline silicon layer 112, and the second electrodes 124 are in electrical contact with the second doped polycrystalline silicon layer 122. A surface of the first doped polycrystalline silicon layer 112 away from the substrate 100 has a plurality of first protrusion structures 1120 (referring to FIG. 3). The second doped polycrystalline silicon layer 122 is insulated from the first doped polycrystalline silicon layer 112, and a surface of the second doped polycrystalline silicon layer 122 away from the substrate 100 has a plurality of second protrusion structures 1220 (referring to FIG. 6). An average thickness of the plurality of first protrusion structures 1120 is greater than an average thickness of the plurality of second protrusion structures 1220, and a thickness of the first doped polycrystalline silicon layer 112 is less than or equal to a thickness of the second doped polycrystalline silicon layer 122.

In some embodiments, the substrate 100 may be made of an elemental semiconductor material. The elemental semiconductor material is formed of a single element, for example, silicon or germanium. The elemental semiconductor material may be in a monocrystalline state, a polycrystalline state, an amorphous state, or a microcrystalline state (referred to a state in which a monocrystalline state and an amorphous state present concurrently). For example, silicon may be at least one of monocrystalline silicon, polycrystalline silicon, amorphous silicon, or microcrystalline silicon.

In some embodiments, the substrate 100 may also be made of a compound semiconductor material. Typical compound semiconductor materials include, but are not limited to, silicon germanium, silicon carbide, gallium arsenide, indium gallide, perovskite, cadmium telluride, copper indium selenium, or other materials. The substrate 100 may be a sapphire substrate, a silicon substrate on an insulator, or a germanium substrate on an insulator.

In some embodiments, the substrate 100 may be an N-type semiconductor substrate or a P-type semiconductor substrate. The N-type semiconductor substrate is doped with an N-type dopant element. The N-type dopant element may be any one of group-V elements, such as phosphorus (P), bismuth (Bi), antimony (Sb), arsenic (As), or the like. The P-type semiconductor substrate is doped with a P-type dopant element. The P-type dopant element may be any one of group-III elements, such as boron (B), aluminum (Al), gallium (Ga), indium (In), or the like.

In some embodiments, the substrate 100 has the front surface 11 and the rear surface 12 that are opposite to each other. The solar cell is a single-sided cell, the front surface may serve as a light-receiving surface configured to receive incident light, and the rear surface faces towards opposite to the incident light. The rear surface may be also capable of receiving incident light, but the efficiency of receiving the incident light by the rear surface is lower than the efficiency of receiving the incident light by the light-receiving surface.

In some embodiments, the solar cell further includes a first dielectric layer 111 disposed between the substrate 100 and the first doped polycrystalline silicon layer 112. The first dielectric layer 111 and the first doped polycrystalline silicon layer 112 form a passivation contact structure. The first doped polycrystalline silicon layer 112 is capable of forming energy band bending on the surface of the substrate 100, and the first dielectric layer 111 causes an asymmetrical offset to an energy band on the surface of the substrate 100, such that a potential barrier of majority carriers of the carriers is lower than a potential barrier of minority carriers of the carriers. Therefore, quantum tunneling of the majority carriers through the first dielectric layer 111 can be easily implemented, whereas it is difficult for the minority carriers to transfer through the first dielectric layer 111. In this way, selective transfer of the carriers can be achieved.

In addition, the first dielectric layer 111 implements a chemical passivation effect. Because interface state defects present on an interface between the substrate 100 and the first dielectric layer 111, the front surface of the substrate 100 has a greater interface state density, and increased interface state density will promote recombination of photo-generated carriers. By disposing the first dielectric layer 111 on the front surface of the substrate 100, chemical passivation can be provided to the surface of the substrate 100 by the first dielectric layer 111. In other words, a recombination rate of the carriers can be reduced by saturating dangling bonds of the substrate 100, lowering a defect state density of the substrate 100, and reducing a number of recombination centers of the substrate 100. In this way, a fill factor, a short-circuit current and an open-circuit voltage of the solar cell can be increased, thereby improving the photoelectric conversion efficiency of the solar cell.

In some embodiments, a thickness of the first dielectric layer 111 ranges from 0.5 nm to 5 nm. The thickness of the first dielectric layer 111 may range from 0.5 nm to 1.3 nm, from 1.3 nm to 2.6 nm, from 2.6 nm to 4.1 nm, or from 4.1 nm to 5 nm. Within any of the above ranges of thickness, the first dielectric layer 111 is relatively thin, and the quantum tunneling of the majority carriers through the first dielectric layer 111 can be easily implemented, whereas it is difficult for the minority carriers to transfer through the first dielectric layer 111. In this way, selective transfer of the carriers can be achieved.

In some embodiments, the first doped polycrystalline silicon layer 112 implements a field passivation effect. An electrostatic field directing to the interior of the substrate 100 is formed on the surface of the substrate 100, such that the minority carriers can escape from the interface, and thus concentration of the minority carriers can be reduced. In this way, the recombination rate of carriers at the interface of the substrate 100 can be reduced, such that the fill factor, the short-circuit current and the open-circuit voltage of the solar cell can be increased, thereby improving the photoelectric conversion efficiency of solar cell.

The first doped polycrystalline silicon layer 112 may be doped with a dopant element of the same type as that doped in the substrate 100. For example, the substrate 100 is doped with an N-type dopant element, and likewise, the first doped polycrystalline silicon layer 112 is also doped with an N-type dopant element.

In some embodiments, the first doped polycrystalline silicon layer 112 is doped with an N-type dopant element, and the N-type dopant element facilitates uniform grains of the first doped polycrystalline silicon layer 112 and ensures a single crystal structure. In addition, the first doped polycrystalline silicon layer 112 doped with the N-type dopant element has small grain sizes, and uniform and a large number of grain boundaries.

Referring to FIG. 3, the first doped polycrystalline silicon layer 112 has a plurality of first protrusion structures 1120. A first protrusion structure 1120 may refer to a pyramid structure or a protrusion structure of any shape. The plurality of first protrusion structures 1120 are also a portion of the first doped polycrystalline silicon layer 112, and the surface of the first doped polycrystalline silicon layer 112 away from the substrate 100 is formed to has a textured structure. The textured structure may serve as a light-trap structure, such that an amount of incident light to the solar cells can be increased, thereby improving the photoelectric conversion efficiency of the solar cell.

The plurality of first protrusion structures 1120 may be structures that are formed by a plurality of grain clusters constructing the first doped polycrystalline silicon layer 112. The plurality of first protrusion structures 1120 may characterize morphology of the first doped polycrystalline silicon layer 112 to a certain degree. The first doped polycrystalline silicon layer 112 includes a plurality of first silicon grains. One or more of the plurality of first silicon grains aggregate to form one respective first protrusion structure 1120, and surfaces of the plurality of first silicon grains form the surface of the first doped polycrystalline silicon layer 112 having a first roughness.

It should be noted that during formation of the first doped polycrystalline silicon layer, silicon atoms are arrayed in diamond lattice structure to form a plurality of crystal nucleuses. The crystal nucleuses grow up to grains having different crystallographic orientations, and these grains aggregate together to form polycrystalline silicon by crystallization. The first silicon grains refer to grains having different crystallographic orientations and constructing polycrystalline silicon.

In some embodiments, in a direction perpendicular to the substrate, one respective first protrusion structure of the plurality of first protrusion structures 1120 has a cross section being shaped as one or more of parabolas, sectors, trapezoids, and approximate trapezoids.

From the image of a cross section obtained using a scanning electron microscopy as shown in FIG. 4, a cross-sectional morphology of the first doped polycrystalline silicon layer can be visually observable. The first doped polycrystalline silicon layer is constructed by a plurality of first silicon grains. The aggregated plurality of first silicon grains form the textured surface of the first doped polycrystalline silicon layer 112. Therefore, the surface of the first doped polycrystalline silicon layer 112 has the first roughness, and has the plurality of first protrusion structures 1120.

In some embodiments, a grain size of one respective first silicon grain ranges from 10 nm to 300 nm. The grain size of the one respective first silicon grains may range from 10 nm to 53 nm, from 53 nm to 95.3 nm, from 95.3 nm to 138.2 nm, from 138.2 nm to 200.6 nm, from 200.6 nm to 248 nm, or from 248 nm to 300 nm. Within any of the above ranges of the grain size, the first silicon grains can construct a surface having a relatively great roughness. Within any of the above ranges of the grain size, good stability between the first silicon grains can be obtained, and hence crystal deformation of the first doped polycrystalline silicon layer 112 is not likely to occur. In addition, when the first silicon grains have grain sizes falling within the above ranges, the first doped polycrystalline silicon layer 112 causes a relatively small stress to the first dielectric layer 111 and a first passivation layer 113, such that performance of the layers between the first doped polycrystalline silicon layer 112 and the first dielectric layer 111, and between the first doped polycrystalline silicon layer 112 and the first passivation layer 113 can be improved.

Referring to FIG. 4, in some embodiments, the first roughness of the surface of the first doped polycrystalline silicon layer 112 having the plurality of first protrusion structures 1120 ranges from 10 nm to 30 nm. The first roughness may range from 10 nm to 13.2 nm, from 13.2 nm to 16 nm, from 16 nm to 22 nm, from 22 nm to 25 nm, or from 25 nm to 30 nm.

In the phrases "first roughness" and "second toughness" hereinafter, the term "roughness" refers to an arithmetic average of absolute values of offsets amounts in a vertical direction, and the offsets amounts are obtained by: defining, in a sampling length (1 µm), an average horizontal line, and determining the offsets amounts of peaks and valleys within the sampling length with respect to the average horizontal line. The roughness may be measured by comparison method, light-sectioning method, interferometry method, and pin-point tracing method.

In some embodiments, referring to FIG. 5, an average thickness h1 of the plurality of first protrusion structures 1120 is less than or equal to 30 nm. The average thickness of the plurality of first protrusion structures 1120 refers to an average value of heights of pyramid structures or any protrusion structures forming the plurality of first protrusion structures.

In some embodiments, referring to FIG. 5, a size d1 in any one dimension of any of the plurality of first protrusion structures is less than 500 µm. The size d1 in any one dimension of any of the plurality of first protrusion structures may range from 0 µm to 80 µm, from 80 µm to 200 µm, from 200 µm to 372 µm, from 372 µm to 430 µm, or from 430 µm to 500 µm. The size in any one dimension of any of the plurality of first protrusion structures 1120 refers to an average value of the size in any one dimension of any of pyramid structures or protrusion structures forming the plurality of first protrusion structures.

In some embodiments, the thickness of the first doped polycrystalline silicon layer 112 ranges from 50 nm to 300 nm. The thickness of the first doped polycrystalline silicon layer 112 may range from 50 nm to 80 nm, from 80 nm to 120 nm, from 120 nm to 200 nm, from 200 nm to 230 nm, from 230 nm to 260 nm, or from 260 nm to 300 nm.

In some embodiments, a disposing density of the plurality of first protrusion structures ranges from 50% to 98%. The disposing density of the plurality of first protrusion structures 1120 may refer to a ratio, per unit length (1 µm), of an area of the first doped polycrystalline silicon layer on which one or more first protrusion structures are disposed to an area of the first doped polycrystalline silicon layer on which no first protrusion structure is disposed.

Referring to FIG. 2, the solar cell further includes a second dielectric layer 121 disposed between the substrate 100 and the second doped polycrystalline silicon layer 122. The second dielectric layer 121 and the second doped polycrystalline silicon layer 122 form a passivation contact structure. The technical details of the second dielectric layer 121 are similar to those of the first dielectric layer 111, which will not be described in detail.

In some embodiments, the thickness of the second doped polycrystalline silicon layer 122 and the principle of forming a passivation contact structure by the second doped polycrystalline silicon layer 122 and the substrate 100 are analogous to the thickness of the first doped polycrystalline silicon layer 112 and the principle of forming the passivation contact structure by the first doped polycrystalline silicon layer 112 and the substrate 100, which will not be described in detail.

In some embodiments, the second doped polycrystalline silicon layer 122 is doped with a P-type dopant element. The P-type dopant element is better compatible with the second dielectric layer 121. Taking the P-type dopant element being B element as an example, the B element may form a B—O bond and a B—Si bond with silicon element and oxygen element, respectively, such that better contact performance can be achieved between the second doped polycrystalline silicon layer 122 and the second dielectric layer 121, and between the second doped polycrystalline silicon layer 122 and the second passivation layer 123, respectively. In this way, the formed second doped polycrystalline silicon layer 122 has a relatively flat surface.

Referring to FIG. 6, the second doped polycrystalline silicon layer 122 has a plurality of second protrusion structures 1220. A second protrusion structure 1220 may refer to a pyramid structure or a protrusion structure of any shape. The plurality of second protrusion structures 1220 are also a portion of the second doped polycrystalline silicon layer 122, and the surface of the second doped polycrystalline silicon layer 122 away from the substrate 100 is formed to has a textured structure. The textured structure may serve as a light-trap structure, such that an amount of incident light to the solar cells can be increased, thereby improving the photoelectric conversion efficiency of the solar cell.

The plurality of second protrusion structures 1220 may be structures that are formed by a plurality of grain clusters constructing the second doped polycrystalline silicon layer 122. The plurality of second protrusion structures 1220 may characterize morphology of the second doped polycrystalline silicon layer 122 to a certain degree. The second doped polycrystalline silicon layer 122 includes a plurality of second silicon grains. One or more of the plurality of second silicon grains aggregate to form one respective second protrusion structure 1220, and surfaces of the plurality of second silicon grains form the surface of the second doped polycrystalline silicon layer 122 having a second roughness.

It should be noted that during formation of the second doped polycrystalline silicon layer 122, silicon atoms are arrayed in diamond lattice structure to form a plurality of crystal nucleuses. The crystal nucleuses grow up to grains having different crystallographic orientations, and these grains aggregate together to form polycrystalline silicon by crystallization. The second silicon grains refer to grains having different crystallographic orientations and constructing polycrystalline silicon.

From the image of a cross section obtained using a scanning electron microscopy as shown in FIG. 7, a cross-sectional morphology of the second doped polycrystalline silicon layer 122 can be visually observable. The second doped polycrystalline silicon layer 122 is constructed by a plurality of second silicon grains. The aggregated plurality of second silicon grains form the textured surface of the second doped polycrystalline silicon layer 122. Therefore, the surface of the second doped polycrystalline silicon layer 122 has the second roughness, and has the plurality of second protrusion structures 1220.

In some embodiments, the second doped polycrystalline silicon layer 122 includes a plurality of second silicon grains, and the surfaces of the plurality of second silicon grains construct the surface of the second doped polycrystalline silicon layer 122 having the second roughness. An average grain size of the plurality of first silicon grains is less than an average grain size of the plurality of second silicon grains.

In some embodiments, a grain size of one respective second silicon grain ranges from 100 nm to 900 nm. The grain size of the one respective second silicon grains may range from 100 nm to 250 nm, from 250 nm to 360 nm, from 360 nm to 490 nm, from 490 nm to 584 nm, from 584 nm to 610 nm, from 610 nm to 790 nm, or from 790 nm to 900 nm. When the second silicon grains have grain sizes falling within any of the above ranges, grain boundaries between the second silicon grains are small, and carriers are capable of easily transferring through the second doped polycrystalline silicon layer 122, such that a migration rate of the carriers can be improved, which is conductive to improvement of efficiency of the solar cell.

The grain size indicates the dimension or scale depicting how large is the silicon grains. Common representations for the grain size include the number of grains per unit volume (ZS), the number of grains per unit area (ZS), or the average line length (or diameter) of the grains. The average line length of the grains refers to a line length of a surface of one respective grain extending along an extension direction of the one respective grain. The grain sizes in the embodiments of the present disclosure may refer to an average line length of the grains.

In some embodiments, the first roughness of the surface of the first doped polycrystalline silicon layer 112 having the plurality of first protrusion structures 1120 is greater than the second roughness of the surface of the second doped polycrystalline silicon layer 122 having the plurality of second protrusion structures 1220. Because of different morphologies of the first doped polycrystalline silicon layer 112 and the second doped polycrystalline silicon layer 122, with respect to the first doped polycrystalline silicon layer 112 having a higher roughness, the surface of the first doped polycrystalline silicon layer 112 can enhance internal reflection of incident light, and reduce optical loss of the solar cell. In addition, the first doped polycrystalline silicon layer 112 can increase the contact area between the first electrodes and the first doped polycrystalline silicon layer 112, thereby improving the contact performance and welding tensile strength of the first doped polycrystalline silicon layer 112. With respect to the second doped polycrystalline silicon layer 122 having a lower roughness, the surface of the second doped polycrystalline silicon layer 122 is smooth, and the second passivation layer deposited thereon has a good uniformity and has a better passivation performance, such that the recombination defects of the solar cell can be overcome.

In some embodiments, the second roughness of the surface of the second doped polycrystalline silicon layer 122 having the plurality of second protrusion structures 1220 ranges from 0 nm to 20 nm. The second roughness may range from 0 nm to 5 nm, from 5 nm to 7.5 nm, from 7.5 nm to 11 nm, from 11 nm to 15 nm, or from 15 nm to 20 nm.

In some embodiments, an average thickness h2 of the plurality of second protrusion structures 1220 is less than or equal to 20 nm.

In some embodiments, a size d2 in any one dimension of any of the plurality of second protrusion structures 1220 is less than 300 μm. The size d2 in any one dimension of any of the plurality of second protrusion structures 1220 may range from 0 μm to 80 μm, from 80 μm to 120 μm, from 120 μm to 180 μm, from 180 μm to 250 μm, or from 250 μm to 300 μm.

In some embodiments, the thickness of the second doped polycrystalline silicon layer 122 ranges from 100 nm to 400 nm. The thickness of the second doped polycrystalline silicon layer 122 may range from 100 nm to 150 nm, from 150 nm to 230 nm, from 230 nm to 280 nm, from 280 nm to 330 nm, or from 330 nm to 400 nm.

In some embodiments, the average thickness of the plurality of first protrusion structures 1120 and the average thickness of the plurality of second protrusion structures 1220 are measured in a following way. A region I is selected on the surface of the first doped polycrystalline silicon layer 112 away from the substrate 100, a region II is selected on the surface of the second doped polycrystalline silicon layer 122 away from the substrate 100, and the region I and the region II may have shapes and areas same as or different from each other, as long as a number of first protrusion structures 1120 in the region I is the same as a number of second protrusion structures 1220 in the region II, for example 20, 30, 50, 90, or the like. Taking there being 30 first protrusion structures 1120 in the region I and 30 second protrusion structures 1220 in the region II as an example, the average thickness of the plurality of first protrusion structures 1120 is determined by an average thickness of the 30 first protrusion structures 1120 in the region I, and the average thickness of the plurality of second protrusion structures 1220 is determined by an average thickness of the 30 second protrusion structures 1220 in the region II. In some other embodiments, one or more regions I may be selected on the surface of the first doped polycrystalline silicon layer 112 away from the substrate 100, and one or more regions II may be selected on the surface of the second doped polycrystalline silicon layer 122 away from the substrate 100, the average thickness of the plurality of first protrusion structures 1120 is determined by an average thickness of the first protrusion structures 1120 in the one or more regions I, and the average thickness of the plurality of second protrusion structures 1220 is determined by an average thickness of the second protrusion structures 1220 in the one or more regions II.

In some embodiments, in the direction perpendicular to the substrate, one respective second protrusion structure of the plurality of second protrusion structures 1220 has a cross section being shaped as one or more of parabolas, sectors, trapezoids, and approximate trapezoids.

In some embodiments, the thickness of the first doped polycrystalline silicon layer 112 is less than or equal to the thickness of the second doped polycrystalline silicon layer 122. In this way, the first doped polycrystalline silicon layer 112 has a smaller thickness, such that the dopant element in the substrate can be easily diffused into the first doped polycrystalline silicon layer 112, and then is collected by the first electrodes. The second doped polycrystalline silicon layer 122 disposed over the rear surface has a larger thickness, such that the risk that the second electrodes burn through the second doped polycrystalline silicon layer 122 and therefore the P-type dopant element is diffused into the substrate due to the excessively small thickness of the second doped polycrystalline silicon layer 122 can be reduced. Thus, the problem that a "dead layer" is formed by the P-type dopant element in the second doped polycrystalline silicon layer 122 aggregating at the interface of the substrate can be prevented, the transfer efficiency of the carriers can be improved, and recombination centers of the carriers can be reduced.

In addition, the first doped polycrystalline silicon layer 112 is disposed over the front surface and has a smaller thickness, such that parasitic absorption of incident light by the first doped polycrystalline silicon layer 112 can be reduced, thereby reducing the optical loss of the solar cell.

In some embodiments, a doping type of the first doped polycrystalline silicon layer 112 is the same as that of the substrate, and a doping type of the second doped polycrystalline silicon layer 122 is different from that of the substrate, that is, the substrate is doped with an N-type dopant element, and the solar cell is a back-junction solar cell. The "junction" refers to a "PN junction". The first doped polycrystalline silicon layer 112 is disposed over the front surface of the substrate, such that the first doped polycrystalline silicon layer 112 and the first dielectric layer can provide good passivation to the substrate, and recombination of photo-generated carriers on the front surface can be reduced. In this way, the photo-generated carriers can transition to the rear surface and be separated into majority carriers and minority carriers to be collected by the first electrodes and the second electrodes. In addition, the first doped polycrystalline silicon layer 112 has a relatively small thickness, such that the optical loss caused by absorption by the first doped polycrystalline silicon layer 112 can be further reduced.

Furthermore, the plurality of first protrusion structures 1120 formed on the front surface of the first doped polycrystalline silicon layer 112 has a relatively large average thickness, such that the light-trap structure formed by the plurality of first protrusion structures 1120 can increase the internal reflection of the incident light, thereby improving the internal reflectivity of the solar cell.

In some embodiments, the substrate is doped with the N-type dopant element, and compared to the P-type cell, the N-type cell has the advantages of high conversion efficiency, low temperature coefficient, high double-sided rate, long lifetime of carriers, and the like.

In some embodiments, the doping type of the first doped polycrystalline silicon layer 112 is reverse to that of the substrate, and the doping type of the second doped polycrystalline silicon layer 122 is the same as that of the substrate, that is, the substrate is doped with a P-type dopant element, and the solar cell is a front-junction solar cell. With respect to the front-junction solar cell, the substrate can collect more sunlight and separation of majority carriers and minority carriers can be implemented on the front surface of the substrate, such that the loss caused by transitioning of carriers through the thickness of the substrate can be prevented. With respect to the first doped polycrystalline silicon layer 112 disposed over the front surface, the first doped polycrystalline silicon layer 112 can ensure the passivation performance provided to the substrate, and the plurality of first protrusion structures 1120 of the first doped polycrystalline silicon layer 112 can improve the internal reflection of the incident light. With respect to the second doped polycrystalline silicon layer 122 disposed over the rear surface, a built-in electric field having high-low junctions can be formed between the second doped polycrystalline silicon layer 122 and the substrate, such that the carriers are promoted to transition from the substrate to the second doped polycrystalline silicon layer 122, and then are collected by the second electrodes.

In some embodiments, the solar cell further includes a first passivation layer 113 covering the surface of the first doped polycrystalline silicon layer 112 away from the substrate.

In some embodiments, the first passivation layer 113 may have a single-layer structure or a stacked structure, and the first passivation layer 113 may be made of one or more of silicon oxide, silicon nitride, silicon oxynitride, silicon carbon oxynitride, titanium oxide, hafnium oxide, or aluminum oxide.

In some embodiments, the solar cell further includes a second passivation layer 123 formed on the surface of the second doped polycrystalline silicon layer 122 away from the substrate. In some embodiments, the second passivation layer 123 may have a single-layer structure or a stacked structure, and the second passivation layer 123 may be made of one or more of silicon oxide, silicon nitride, silicon oxynitride, silicon carbon oxynitride, titanium oxide, hafnium oxide, or aluminum oxide.

In some embodiments, a spacing between two first electrodes 114 immediately adjacent to each other or a spacing between two second electrodes 124 immediately adjacent to each other along a first direction X ranges from 0.5 mm to 2 mm. The spacing between two first electrodes 114 immediately adjacent to each other or the spacing between two second electrodes 124 immediately adjacent to each other along the first direction X may range from 0.5 mm to 0.8 mm, from 0.8 mm to 1.15 mm, from 1.15 mm to 1.28 mm, from 1.28 mm to 1.46 mm, from 1.46 mm to 1.68 mm, from 1.68 mm to 1.84 mm, or from 1.84 mm to 2 mm.

In some embodiments, a width of one respective first electrode 114 in the first direction X or a width of one respective second electrode 124 in the first direction X ranges from 5 µm to 50 µm. The width of one respective first electrode 114 in the first direction X or the width of one respective second electrode 124 in the first direction X may range from 5 µm to 9 µm, from 9 µm to 14 µm, from 14 µm to 23 µm, from 23 µm to 34 µm, from 34 µm to 42 µm, from 42 µm to 45 µm, from 45 µm to 48 µm, or from 48 µm to 50 µm.

In some embodiments, the first electrodes 114 may be sintered from a firing-through paste. A method for forming the first electrodes 114 includes: printing a metal paste on a part of a surface of the first passivation layer 113 using a screen printing process. The metal paste may include at least one of silver, aluminum, copper, tin, gold, lead, or nickel. Then, the metal paste is subjected to a sintering process, and the metal paste includes a material having a highly corrosive component such as powder of glass, such that during sintering, the corrosive component corrodes the first passivation layer 113, thereby allowing the metal paste to penetrate through the first passivation layer 113 and to come into electrical contact with the first doped polycrystalline silicon layer 112.

In some embodiments, the second electrodes 124 may be sintered from a firing-through paste. A method for forming the second electrodes 124 includes: printing a metal paste on a part of a surface of the second passivation layer 123 using a screen printing process. The metal paste may include at least one of silver, aluminum, copper, tin, gold, lead, or nickel. Then, the metal paste is subjected to a sintering process, and the metal paste includes a material having a highly corrosive component such as powder of glass, such that during sintering, the corrosive component corrodes the second passivation layer 123, thereby allowing the metal paste to penetrate through the second passivation layer 123 and to come into electrical contact with the second doped polycrystalline silicon layer 122.

In some embodiments, referring to FIG. 2, a front surface of the substrate has a textured structure 13. The textured structure 13 includes a plurality of pyramid structures 101 and serves as a light-trap structure. The inclined surfaces of the textured structure can improve the internal reflection of the incident light, thereby improving the absorption and utilization rates of the incident light by the substrate, and improving the photoelectric conversion efficiency of the solar cell.

Figure 9:
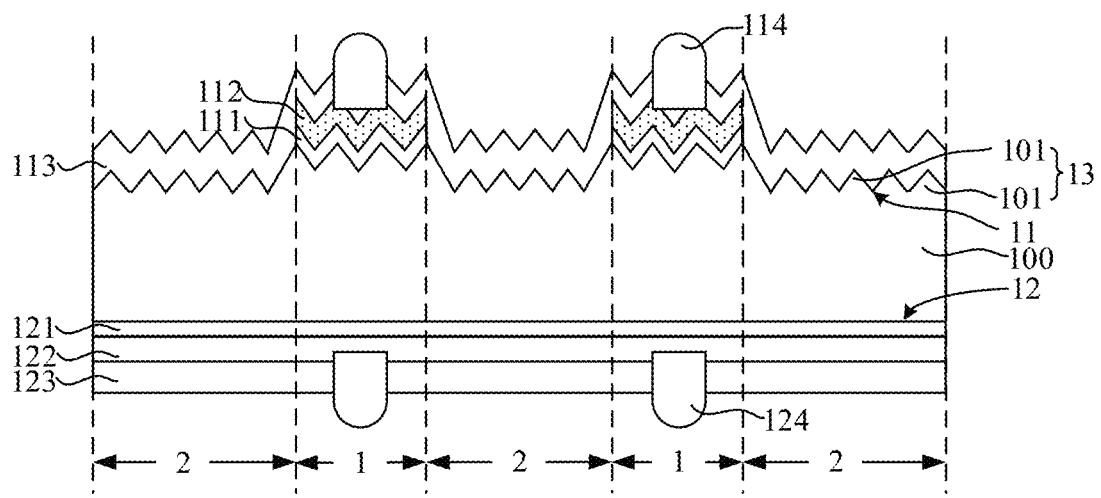
FIG. 9 is a schematic diagram of a structure of a second cross section, taken along the line A1-A2, of the solar cell in FIG. 1.

In some embodiment, referring FIG. 9, FIG. 9 is a schematic diagram of a structure of a second cross section, taken along the line A1-A2, of the solar cell in FIG. 1. The front surface of the substrate includes metallic regions 1 and non-metallic regions 2. The first doped polycrystalline silicon layer 112 and the first dielectric layer 111 are disposed in the metallic regions 1.

In some embodiments, the metallic regions 1 refer to regions where orthographic projections of the first electrodes 114 fall on the substrate 100, and the non-metallic regions 2 refer to regions outside the orthographic projections of the first electrodes 114 on the substrate 100. In order to ensure that the layer in contact with the first electrodes 114 has greater dopant concentration or all regions in contact with the first electrodes 114 belong to the first doped polycrystalline silicon layer 112, typically an area of each metallic region 1 is designed to be greater than an area of a respective first electrode 114.

The first doped polycrystalline silicon layer 112 is disposed in the metallic regions 1 of the substrate 100, such that the parasitic absorption by the first doped polycrystalline silicon layer can be reduced comparing with the first doped polycrystalline silicon layer of which at least a part is formed in the non-metallic regions 2, thereby improving the photoelectric conversion efficiency of the solar cell.

In the solar cell according to the above embodiments of the present disclosure, the surface of the first doped polycrystalline silicon layer 112 away from the substrate 100 has the plurality of first protrusion structures 1120, and the thickness of the first doped polycrystalline silicon layer 112 is less than the thickness of the second doped polycrystalline silicon layer 122. Because the N-type doped polycrystalline silicon layer is of a type of donor, the formed first doped polycrystalline silicon layer 112 has relatively small silicon grains, relatively great bonding tightness between silicon grains, and a resulted relatively small thickness of the formed layer. In contrast, because the P-type doped polycrystalline silicon layer is of a type of acceptor type and has a good compatibility with the substrate, the P-type doped polycrystalline silicon layer has relatively large silicon grains, and thus the second doped polycrystalline silicon layer 122 formed by bonding of the silicon grains has a relatively great thickness.

In addition, the average thickness of the plurality of first protrusion structures 1120 is greater than the average thickness of the plurality of second protrusion structures 1220. In this way, internal reflection in the first doped polycrystalline silicon layer 112 and contact performance between the first doped polycrystalline silicon layer 112 and the first electrodes 114 can be improved. The plurality of second protrusion structures 1220 of the second doped polycrystalline silicon layer 122 have a relatively small average thickness, thus the second doped polycrystalline silicon layer 122 can improve passivation performance of the layer formed thereon.

Some embodiments of the present disclosure provide another solar cell. In the solar cell as described in the above embodiments, the first doped polycrystalline silicon layer is disposed over the front surface, and the first passivation layer covers the surface of the first doped polycrystalline silicon layer. In the another solar cell, the first doped polycrystalline silicon layer is disposed over the rear surface and includes a plurality of portions, the second doped polycrystalline silicon layer includes a plurality of portions, and the plurality of portions of the first doped polycrystalline silicon layer interleave with the plurality of portions of the second doped polycrystalline silicon layer. The second passivation layer covers the surfaces of the first doped polycrystalline silicon layer and the second doped polycrystalline silicon layer. The technical features identical or similar to those in the above embodiments will not be described here in detail.

Figure 10:
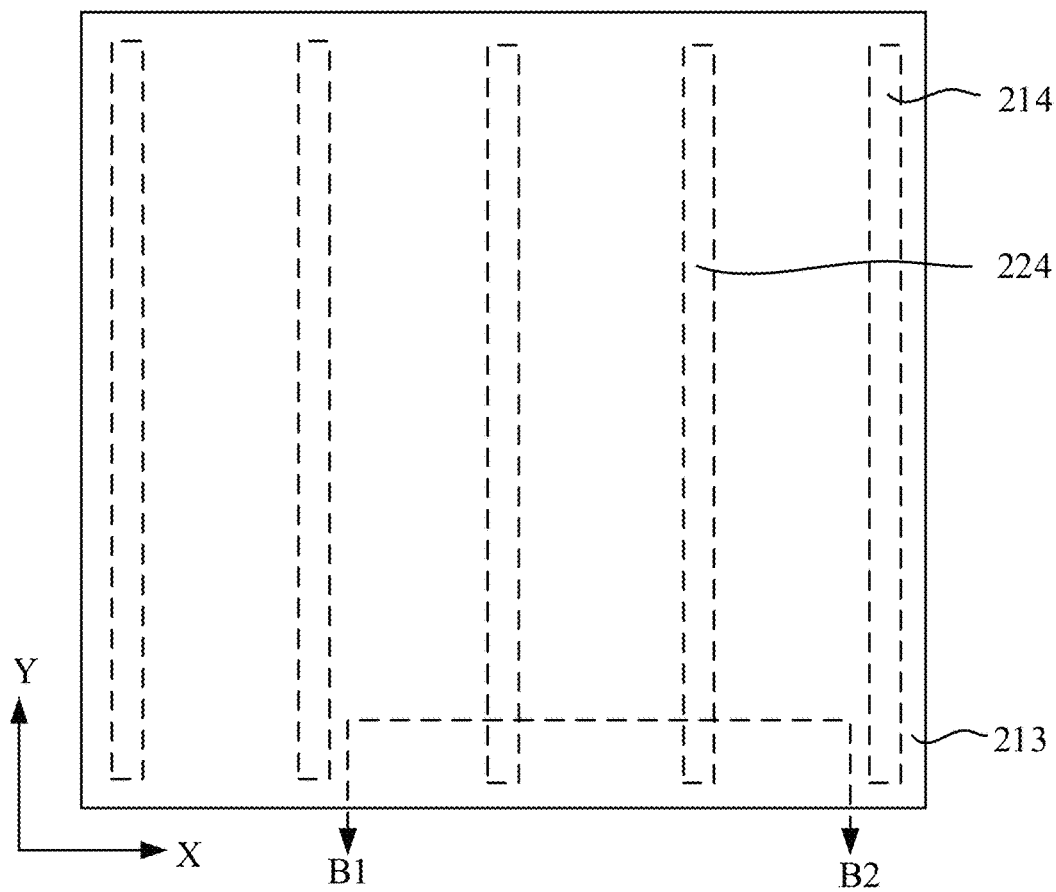
FIG. 10 is a schematic diagram of a structure of another solar cell according to some embodiments of the present disclosure.
Figure 11:
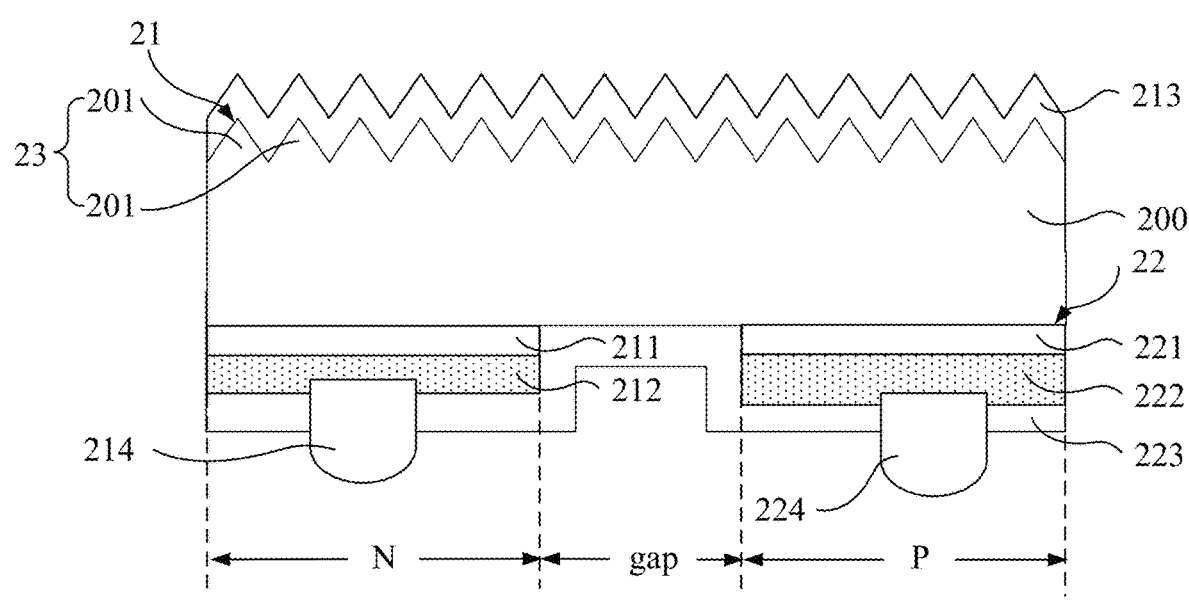
FIG. 11 is a schematic diagram of a structure of a first cross section, taken along a line B1-B2, of the solar cell in FIG. 10.

FIG. 10 is a schematic diagram of a structure of another solar cell according to some embodiments of the present disclosure. FIG. 11 is a schematic diagram of a structure of a first cross section, taken along a line B1-B2, of the solar cell in FIG. 10.

Referring to FIG. 10 and FIG. 11, the solar cell includes: a substrate 200 having a front surface 21 and a rear surface 22 opposite to each other, a first doped polycrystalline silicon layer 212 doped with N-type dopant ions and disposed over the rear surface 22, a second doped polycrystalline silicon layer 222 doped with P-type dopant ions and disposed over the rear surface 22, and first electrodes 214 and second electrodes 224. The first electrodes 214 are in electrical contact with the first doped polycrystalline silicon layer 212, and the second electrodes 224 are in electrical contact with the second doped polycrystalline silicon layer 222. A surface of the first doped polycrystalline silicon layer 212 away from the substrate 200 has a plurality of first protrusion structures. The second doped polycrystalline silicon layer 222 is insulated from the first doped polycrystalline silicon layer 212, and a surface of the second doped polycrystalline silicon layer 222 away from the substrate 200 has a plurality of second protrusion structures. An average thickness of the plurality of first protrusion structures is greater than an average thickness of the plurality of second protrusion structures, and a thickness of the first doped polycrystalline silicon layer 212 is less than or equal to a thickness of the second doped polycrystalline silicon layer 222.

In some embodiments, the rear surface 22 has a plurality of N regions and a plurality of P regions, each portion of the plurality of portions of the first doped polycrystalline silicon layer 212 is disposed over a respective N region of the plurality of N regions, and each portion of the plurality of portions of the second doped polycrystalline silicon layer 222 is disposed over a respective P region of the plurality of P regions.

In some embodiments, the front surface 21 of the substrate 200 has a textured structure 23. The textured structure 23 includes a plurality of pyramid structures 201. The textured structure 23 may include pyramid structures of regular shapes or black silicon of irregular shapes.

In some embodiments, a front surface field (FSF) layer is formed on the front surface 21 of the substrate, in which dopant ions have a conductivity type same as a conductivity type of dopant ions in the substrate. In this way, the concentration of the minority carriers on the surface can be reduced by virtue of the field passivation effect, thereby reducing the recombination rate on the surface, and decreasing the series resistance to improve the transfer capability of electrons.

In some embodiments, the rear surface 22 of the substrate is a polished surface. The polished surface refers to a flat surface formed by removing the textured structure on the surface by a polishing solution or by laser etching. The polished rear surface has an increased flatness and thus reflection of light of long wavelengths is enhanced. In this way, secondary absorption of the incident light can be promoted, such that the short-circuit current can be increased. Moreover, since the specific surface area of the rear surface is decreased, thereby reducing the recombination occurred on the rear surface, and improving the passivation effect on the rear surface.

In some embodiments, a gap region is present between each P region of the plurality of P regions and a respective N region of the plurality of N regions, and the second passivation layer includes portions disposed in gap regions.

In some embodiment, a groove is formed between each P region of the plurality of P regions and a respective N region of the plurality of N regions, in order to implement automatic isolation between regions of different conductivity types. In this way, the impact on efficiency of the solar cell due to leakage resulted by formation of tunnel junctions between heavily doped P regions and N regions on the rear surface of the IBC cell can be eliminated. Referring to FIG. 11, the solar cell further includes: a first dielectric layer 211 and a second dielectric layer 221. The first dielectric layer 211 is disposed between the substrate 200 and the first doped polycrystalline silicon layer 212; and the second dielectric layer 221 is disposed between the substrate 200 and the second doped polycrystalline silicon layer 222.

In some embodiments, a first roughness of the surface of the first doped polycrystalline silicon layer 212 having the plurality of first protrusion structures ranges from 10 nm to 30 nm.

In some embodiments, the average thickness of the plurality of first protrusion structures is less than or equal to 30 nm. In some embodiments, a size in any one dimension of any of the plurality of first protrusion structures is less than 500 μm.

In some embodiments, the thickness of the first doped polycrystalline silicon layer 212 ranges from 50 nm to 300 nm.

In some embodiments, a disposing density of the plurality of first protrusion structures ranges from 50% to 98%.

In some embodiments, a second roughness of the surface of the second doped polycrystalline silicon layer 222 having the plurality of second protrusion structures ranges from 0 nm to 20 nm.

In some embodiments, the average thickness of the plurality of second protrusion structures is less than or equal to 20 nm.

In some embodiments, a size in any one dimension of any of the plurality of second protrusion structures is less than 300 μm.

In some embodiments, the thickness of the second doped polycrystalline silicon layer 222 ranges from 100 nm to 400 nm.

In some embodiments, the solar cell further includes: a first passivation layer 213 and a second passivation layer 223. The first passivation layer 213 covers the front surface 21, and the second passivation layer 223 covers the first doped polycrystalline silicon layer 212, the second doped polycrystalline silicon layer 222, and the gap regions.

In some embodiments, the first electrodes 214 are disposed in the N regions, and the second electrodes 224 are disposed in the P regions.

Figure 12:
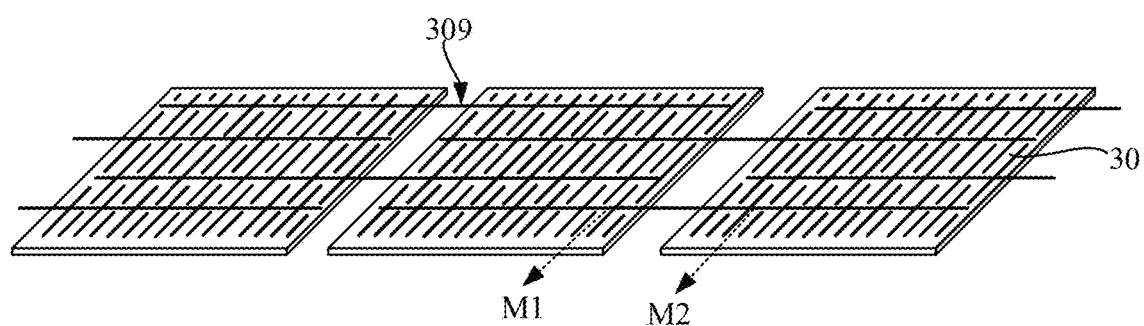
FIG. 12 is a schematic diagram of a structure of a photovoltaic module according to some embodiments of the present disclosure.
Figure 13:
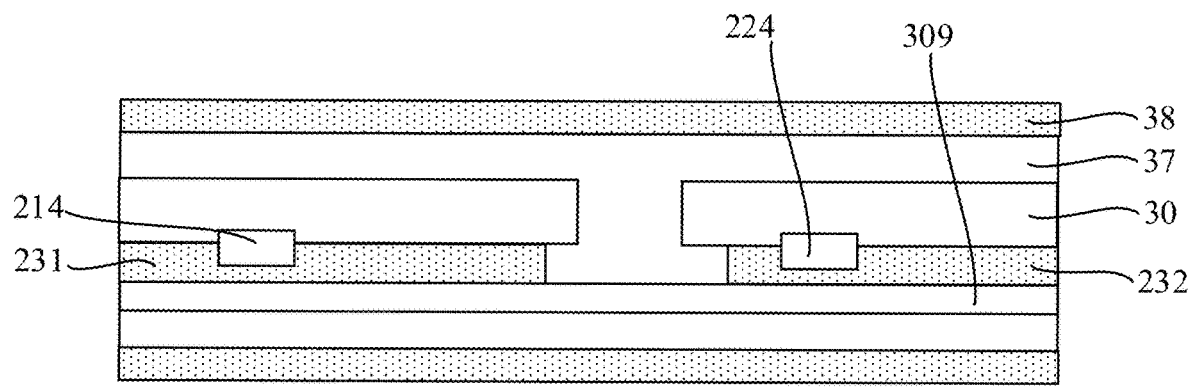
FIG. 13 is a schematic diagram of a structure of a cross section, taken along a line M1-M2, of the photovoltaic module in FIG. 12.

FIG. 12 is a schematic diagram of a structure of a photovoltaic module according to some embodiments of the present disclosure. FIG. 13 is a schematic diagram of a structure of a cross section, taken along a line M1-M2, of the photovoltaic module in FIG. 12.

Some embodiments of the present disclosure provide a photovoltaic module. The photovoltaic module includes the solar cell according to the above embodiments. The technical details that have been described in the above embodiments will not be repeated here.

Referring to FIG. 12, the photovoltaic module includes: at least one cell string formed by connecting, using connection parts, a plurality of solar cells 30 according to any of the above embodiments, at least one encapsulation adhesive layer 37 configured to cover a surface of the at least one cell string, and at least one cover plate 38 configured to cover a surface of the at least one encapsulation adhesive layer 37 away from the cell string.

In some embodiments, a plurality of cell strings may be electrically connected to each other using the connection parts 309 by welding the connection parts 309 to bus bars on solar cells. The bus bars include first bus bars 231 electrically connected to the first electrodes 214 and second bus bars 232 electrically connected to the second electrodes 224.

In some embodiments, no gap is present between adjacent solar cells, i.e., adjacent solar cells are overlapped with each other.

In some embodiments, the connection parts are welded to finger electrodes on the solar cells, and the finger electrodes include the first electrodes 214 and the second electrodes 224.

In some embodiments, an encapsulation adhesive layer 37 includes a first encapsulation layer covering one of front surfaces and rear surfaces of the solar cells and a second encapsulation layer covering the other one of the front surfaces and the rear surfaces of the solar cells. At least one of the first encapsulation layer or the second encapsulation layer may be an organic encapsulation adhesive layer such as a polyvinyl butyral (PVB) adhesive layer, an ethylene-vinyl acetate (EVA) adhesive layer, a polyethylene octene co-elastomer (POE) adhesive layer, or a polyethylene terephthalate (PET) adhesive layer.

It should be noted that the first encapsulation layer and the second encapsulation layer have demarcations before lamination, and that forming the photovoltaic module after lamination may fuse the first encapsulation layer and the second encapsulation layer, that is, the first encapsulation layer and the second encapsulation layer form an integral encapsulation adhesive layer 37.

In some embodiments, the at least one cover plate 38 may be a glass cover plate, a plastic cover plate, or the like that has a light transmission function. A surface of a cover plate 38 facing towards the at least one encapsulation adhesive layer 37 may be a textured surface, thereby increasing the utilization rate of incident light. A cover plate 38 includes a first cover plate and a second cover plate. The first cover plate is opposite to the first encapsulation layer, and the second cover plate is opposite to the second encapsulation layer; or the first cover plate is opposite to one side of the solar cells, and the second cover plate is opposite to the other side of the solar cells.

Those having ordinary skill in the art shall understand that the above embodiments are exemplary implementations for realizing the present disclosure. In practice, any person skilled in the art to which the embodiments of the present disclosure belong may make any modifications and changes in forms and details without departing from the scope of the present disclosure. Therefore, the patent scope of protection of the present disclosure shall still be subject to the scope limited by the appended claims.

What is claimed is:

1. A solar cell, comprising:
   a substrate, having a front surface and a rear surface opposite to each other;
   a first doped polycrystalline silicon layer, doped with N-type dopant ions and disposed over the rear surface;
   a second doped polycrystalline silicon layer, doped with P-type dopant ions and disposed over the rear surface; and
   first electrodes and second electrodes, wherein the first electrodes are in electrical contact with the first doped polycrystalline silicon layer, and the second electrodes are in electrical contact with the second doped polycrystalline silicon layer;
   wherein a surface of the first doped polycrystalline silicon layer away from the substrate has a plurality of first protrusion structures;
   wherein the second doped polycrystalline silicon layer is insulated from the first doped polycrystalline silicon layer, and a surface of the second doped polycrystalline silicon layer away from the substrate has a plurality of second protrusion structures; and
   wherein an average thickness of the plurality of first protrusion structures is greater than an average thickness of the plurality of second protrusion structures, and a thickness of the first doped polycrystalline silicon layer is less than or equal to a thickness of the second doped polycrystalline silicon layer.

2. The solar cell according to claim 1, wherein a roughness of the surface of the first doped polycrystalline silicon layer is greater than a roughness of the surface of the second doped polycrystalline silicon layer.

3. The solar cell according to claim 2, wherein the roughness of the surface of the first doped polycrystalline silicon layer ranges from 10 nm to 30 nm.

4. The solar cell according to claim 2, wherein the roughness of the surface of the second doped polycrystalline silicon layer ranges from 0 nm to 20 nm.

5. The solar cell according to claim 1, wherein the average thickness of the plurality of first protrusion structures is less than or equal to 30 nm.

6. The solar cell according to claim 1, wherein the average thickness of the plurality of second protrusion structures is less than or equal to 20 nm.

7. The solar cell according to claim 1, wherein a size in any one dimension of any of the plurality of first protrusion structures is less than 500 μm.

8. The solar cell according to claim 1, wherein a size in any one dimension of any of the plurality of second protrusion structures is less than 300 μm.

9. The solar cell according to claim 1, wherein the thickness of the second doped polycrystalline silicon layer ranges from 100 nm to 400 nm.

10. The solar cell according to claim 1, wherein the thickness of the first doped polycrystalline silicon layer ranges from 50 nm to 300 nm.

11. The solar cell according to claim 1, wherein the first doped polycrystalline silicon layer includes a plurality of portions, the second doped polycrystalline silicon layer includes a plurality of portions, and the plurality of portions of the first doped polycrystalline silicon layer interleave with the plurality of portions of the second doped polycrystalline silicon layer; and
   wherein the rear surface has a plurality of N regions and a plurality of P regions, each portion of the plurality of portions of the first doped polycrystalline silicon layer is disposed over a respective N region of the plurality of N regions, and each portion of the plurality of portions of the second doped polycrystalline silicon layer is disposed over a respective P region of the plurality of P regions.

12. The solar cell according to claim 1, wherein in a direction perpendicular to the substrate, at least one of one respective first protrusion structure of the plurality of first protrusion structures and one respective second protrusion structure of the plurality of second protrusion structures has a cross section shaped as one or more of parabolas, sectors, trapezoids, and approximate trapezoids.

13. A photovoltaic module, comprising:
at least one cell string, formed by connecting a plurality of solar cells;
at least one encapsulation adhesive layer, configured to cover a surface of the at least one cell string; and
at least one cover plate, configured to cover a surface of the at least one encapsulation adhesive layer away from the at least one cell string;
wherein each solar cell of the plurality of solar cells includes:
a substrate, having a front surface and a rear surface opposite to each other;
a first doped polycrystalline silicon layer, doped with N-type dopant ions and disposed over the rear surface;
a second doped polycrystalline silicon layer, doped with P-type dopant ions and disposed over the rear surface; and
first electrodes and second electrodes, wherein the first electrodes are in electrical contact with the first doped polycrystalline silicon layer, and the second electrodes are in electrical contact with the second doped polycrystalline silicon layer;
wherein a surface of the first doped polycrystalline silicon layer away from the substrate has a plurality of first protrusion structures;
wherein the second doped polycrystalline silicon layer is insulated from the first doped polycrystalline silicon layer, and a surface of the second doped polycrystalline silicon layer away from the substrate has a plurality of second protrusion structures; and
wherein an average thickness of the plurality of first protrusion structures is greater than an average thickness of the plurality of second protrusion structures, and a thickness of the first doped polycrystalline silicon layer is less than or equal to a thickness of the second doped polycrystalline silicon layer.

14. The photovoltaic module according to claim 13, wherein a roughness of the surface of the first doped polycrystalline silicon layer is greater than a roughness of the surface of the second doped polycrystalline silicon layer.

15. The photovoltaic module according to claim 14, wherein the roughness of the surface of the first doped polycrystalline silicon layer ranges from 10 nm to 30 nm.

16. The photovoltaic module according to claim 14, wherein the roughness of the surface of the second doped polycrystalline silicon layer ranges from 0 nm to 20 nm.

17. The photovoltaic module according to claim 13, wherein the average thickness of the plurality of first protrusion structures is less than or equal to 30 nm.

18. The photovoltaic module according to claim 13, wherein the average thickness of the plurality of second protrusion structures is less than or equal to 20 nm.

19. The photovoltaic module according to claim 13, wherein a size in any one dimension of any of the plurality of first protrusion structures is less than 500 μm.

20. The photovoltaic module according to claim 13, wherein the first doped polycrystalline silicon layer includes a plurality of portions, the second doped polycrystalline silicon layer includes a plurality of portions, and the plurality of portions of the first doped polycrystalline silicon layer interleave with the plurality of portions of the second doped polycrystalline silicon layer; and
wherein the rear surface has a plurality of N regions and a plurality of P regions, each portion of the plurality of portions of the first doped polycrystalline silicon layer is disposed over a respective N region of the plurality of N regions, and each portion of the plurality of portions of the second doped polycrystalline silicon layer is disposed over a respective P region of the plurality of P regions.

* * * * *